US010347266B2

(12) United States Patent
Ehara

(10) Patent No.: US 10,347,266 B2
(45) Date of Patent: Jul. 9, 2019

(54) SPEECH SIGNAL DECODING DEVICE AND METHOD FOR DECODING SPEECH SIGNAL

(71) Applicant: PANASONIC INTELLECTUAL PROPERTY MANAGEMENT CO., LTD., Osaka (JP)

(72) Inventor: Hiroyuki Ehara, Kanagawa (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 15/736,501

(22) PCT Filed: May 20, 2016

(86) PCT No.: PCT/JP2016/002465
§ 371 (c)(1),
(2) Date: Dec. 14, 2017

(87) PCT Pub. No.: WO2017/022151
PCT Pub. Date: Feb. 9, 2017

(65) Prior Publication Data
US 2018/0182407 A1    Jun. 28, 2018

(30) Foreign Application Priority Data
Aug. 5, 2015 (JP) .................. 2015-155009

(51) Int. Cl.
*G10L 25/90* (2013.01)
*G10L 19/125* (2013.01)
(Continued)

(52) U.S. Cl.
CPC .......... *G10L 19/125* (2013.01); *G10L 19/005* (2013.01); *G10L 19/16* (2013.01);
(Continued)

(58) Field of Classification Search
CPC ......... G10L 25/90; G10L 25/93; G10L 19/09; G10L 19/08; G10L 19/12; G10L 19/125;
(Continued)

(56) References Cited

U.S. PATENT DOCUMENTS 5,091,945 A * 2/1992 Kleijn .................... G10L 19/12
704/219
5,506,899 A    4/1996 Kimura
(Continued)

FOREIGN PATENT DOCUMENTS

| JP | 07-058687 | 3/1995 |
| JP | 2007-221807 | 8/2007 |
| JP | 2008-283415 | 11/2008 |

OTHER PUBLICATIONS

International Search Report, dated Jul. 19, 2016 by the Japan Patent Office (JPO), for the corresponding International Application No. PCT/JP2016/002465.

*Primary Examiner* — Feng-Tzer Tzeng
(74) *Attorney, Agent, or Firm* — Greenblum & Bernstein, P.L.C.

(57) ABSTRACT

A speech signal decoding device includes an adaptive code-book decoder, a fixed code-book decoder, a ratio calculator, a determination unit, and an attenuator. The adaptive code-book decoder generates an adaptive code-book vector using an adaptive code-book code of an encoded signal encoded by a CELP method. The fixed code-book decoder generates a fixed code-book vector using a fixed code-book code of the encoded signal. The ratio calculator calculates an amplitude ratio or an energy ratio between the adaptive code-book vector and the fixed code-book vector. The determination unit determines whether the amplitude ratio or the energy ratio exceeds a predetermined threshold. When the amplitude ratio or the energy ratio is determined to exceed the predetermined threshold, the attenuator attenuates an exci-
(Continued)

tation signal that has been defined by adding the adaptive code-book vector to the fixed code-book vector.

6 Claims, 4 Drawing Sheets

(51) Int. Cl.
| | |
|---|---|
| *H03M 7/30* | (2006.01) |
| *G10L 19/16* | (2013.01) |
| *G10L 19/005* | (2013.01) |
| *G10L 19/08* | (2013.01) |
| *G10L 21/003* | (2013.01) |
| *G10L 19/12* | (2013.01) |

(52) U.S. Cl.
 CPC ............... *H03M 7/30* (2013.01); *G10L 19/08* (2013.01); *G10L 19/12* (2013.01); *G10L 21/003* (2013.01); *G10L 25/90* (2013.01)

(58) Field of Classification Search
 CPC ....... G10L 19/13; G10L 19/135; G10L 19/20; G10L 19/22; G10L 21/003; G10L 21/013; G10L 2019/0011; G10L 2025/90; G10L 2025/906
 See application file for complete search history.

(56) References Cited

U.S. PATENT DOCUMENTS

| | | | |
|---|---|---|---|
| 6,564,182 B1* | 5/2003 | Gao | ........................ G10L 25/90 704/207 |
| 6,810,377 B1* | 10/2004 | Ho | ........................ G10L 19/005 704/208 |
| 2007/0100614 A1* | 5/2007 | Yoshida | ................ G10L 19/005 704/223 |

* cited by examiner

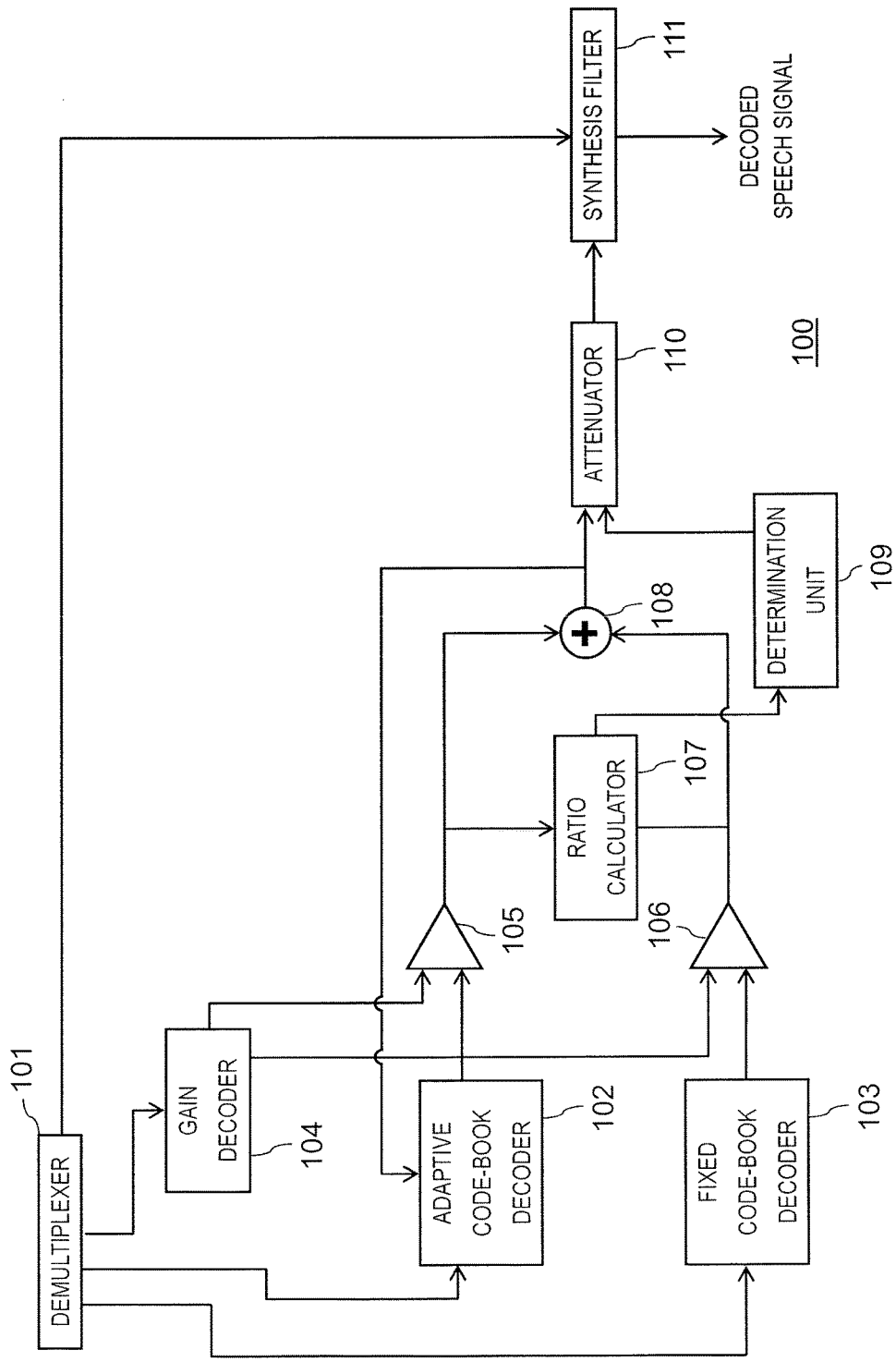

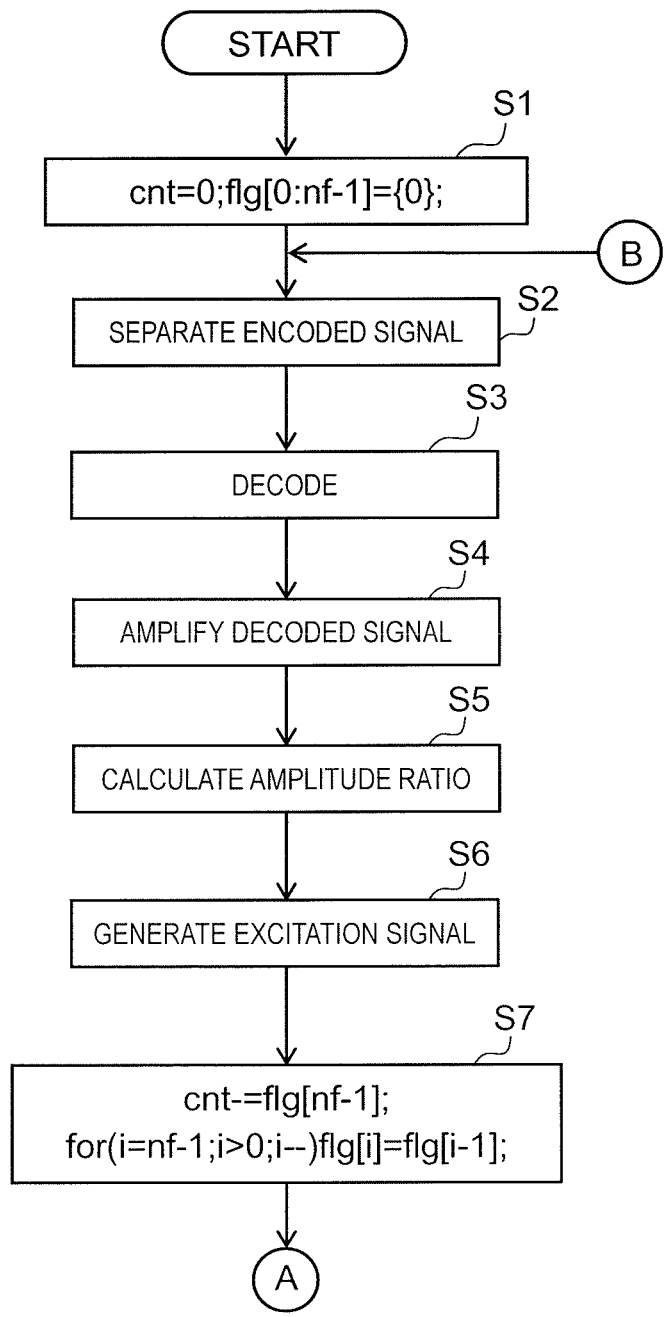

SPEECH SIGNAL DECODING DEVICE AND METHOD FOR DECODING SPEECH SIGNAL

TECHNICAL FIELD

The present invention relates to a speech signal decoding device and a method for decoding a speech signal configured to decode an encoded speech signal.

BACKGROUND ART

Conventionally, a technique of speech encoding that performs data compression by encoding speech has been used in various fields such as mobile phones, Voice over Internet Protocol (VoIP), broadcasting, and recording, namely, demand for this technique has been increasing. In some cases, confidentiality of communication is enhanced by encrypting encoded information. In this case, the encryption is first decrypted to retrieve an encoded signal that has been encoded by various speech encoding techniques. Then the encoded signal is decoded into a speech signal for enabling reproduction of speech.

Until decrypting processing is performed on the encoded signal that has been encrypted, if a part of the encoded signal that has been encrypted is lost, or an error occurs due to a noise or a transmission failure, the encryption cannot be decrypted and therefore in some cases, the encoded information cannot normally be decoded. Furthermore, when information about an encryption key contains an error, encoded information after decrypting the encryption also contains an error. Thus, a speech signal to be decoded is considerably damaged. In a case where the encoded information is not normally decoded, when a decoded signal having excessive amplitude is reproduced, an abnormal sound with large volume might be generated. Note that, when the encryption is omitted, an error may directly contaminates the encoded signal on, for example, a transmission path before decoding the encoded signal, and then the above-described case may be caused.

As a technique for avoiding such an error, for example, PTL 1 discloses a mobile device (decoding device) that adds an encryption header to an encoded signal upon encrypting, and removes the encryption header upon decoding to perform decoding based on information about encrypting algorithm used for encoding, which is contained in the encryption header.

PTL 2 discloses an encrypting device and a decrypting device. The encrypting device divides speech code information into encryption target data and non-encryption target data, and encrypts the encryption target data using an initial vector generated based on the non-encryption target data and a predetermined key, and combines those sets of data to transmit to the decrypting device. The decrypting device generates the initial vector by separating the non-encryption target data upon decrypting, and performs decrypting using the predetermined key and those sets of data.

As a technique for avoiding generation of an abnormal sound with large volume caused by an error, for example, PTL 3 discloses a speech suppressing device that stops output of the speech signal, when a decoded speech signal has a higher level than a predetermined threshold.

CITATION LIST

Patent Literature

PTL 1: Unexamined Japanese Patent Publication No. 2007-221807

PTL 2: Unexamined Japanese Patent Publication No. 2008-283415

PTL 3: Unexamined Japanese Patent Publication No. H07-58687

SUMMARY OF THE INVENTION

However, in the mobile device (decoding device) disclosed in PTL 1, an amount of information of the encoded signal is increased by adding the encryption header. When an amount of information of the encryption header is decreased for avoiding such increase in the amount of information, a header length must be shortened, and therefore error detection performance is degraded.

In the encrypting device and the decrypting device disclosed in PTL 2, the non-encryption target data is transmitted without being encrypted from the encrypting device to the decrypting device. This causes a problem in terms of security.

Furthermore, in the speech suppressing device disclosed in PTL 3, only a level of a decoded signal is referred, and when the level is higher than the threshold, output is stopped. Therefore, also when a level of an original speech signal is high, the speech signal may not be unfortunately reproduced.

From those situations, a speech signal decoding device that can avoid reproduction of an abnormal sound with large volume due to an error in a signal, without influencing reproduction of a normal decoded signal, is demanded.

The present invention provides a speech signal decoding device and a method for decoding a speech signal that can avoid reproduction of an abnormal sound with large volume due to an error in a signal, without influencing reproduction of a normal decoded signal.

The speech signal decoding device of the present invention includes an adaptive code-book decoder, a fixed code-book decoder, a ratio calculator, a determination unit, and an attenuator. The adaptive code-book decoder generates an adaptive code-book decoded component using an adaptive code-book code of an encoded signal encoded by a code-excited linear prediction (CELP) method. The fixed code-book decoder generates a fixed code-book decoded component using a fixed code-book code of the encoded signal. The ratio calculator calculates an amplitude ratio or an energy ratio between the adaptive code-book decoded component and the fixed code-book decoded component. The determination unit determines whether the amplitude ratio or the energy ratio, which has been calculated by the ratio calculator, exceeds a predetermined threshold. When the determination unit determines that the amplitude ratio or the energy ratio exceeds the predetermined threshold, the attenuator attenuates an excitation signal that has been defined by adding the adaptive code-book decoded component to the fixed code-book decoded component.

The method for decoding the speech signal of the present invention includes generating an adaptive code-book decoded component, generating a fixed code-book decoded component, calculating a ratio, determining, and attenuating. In the generating the adaptive code-book decoded component, an adaptive code-book decoded component is generated by using an adaptive code-book code of an encoded signal encoded by the CELP method. In the generating the fixed code-book decoded component, a fixed code-book decoded component is generated by using a fixed code-book code of the encoded signal. In the calculating the ratio, an amplitude ratio or an energy ratio between the adaptive code-book decoded component and the fixed code-book decoded component is calculated. In the determining, a determination is made whether the amplitude ratio or the energy ratio exceeds a predetermined threshold. In the attenuating, when the amplitude ratio or the energy ratio is determined to exceed the predetermined threshold, an excitation signal that has been defined by adding the adaptive code-book decoded component to the fixed code-book decoded component is attenuated.

BRIEF DESCRIPTION OF DRAWINGS

FIG. 1 is a diagram illustrating an example of a configuration of a speech signal decoding device according to an exemplary embodiment of the present invention.

FIG. 3 is a flowchart illustrating an operation example of the speech signal decoding device.

DESCRIPTION OF EMBODIMENT

Figure 2A:
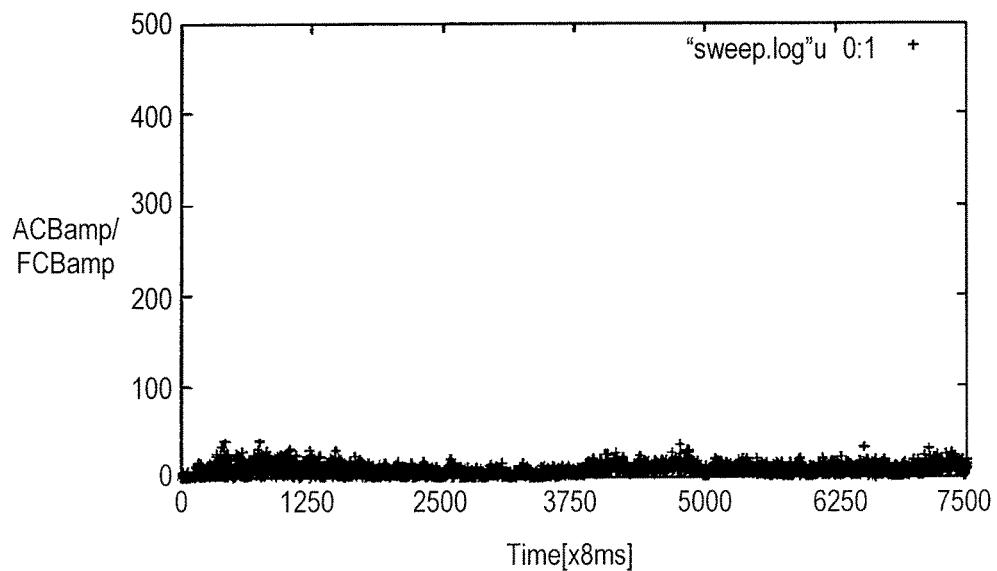
FIG. 2A is a view illustrating an ACB/FCB amplitude ratio.

Hereinafter, an exemplary embodiment of the present invention will now be described in detail. FIG. 1 is a diagram illustrating an example of a configuration of speech signal decoding device 100 according to the exemplary embodiment of the present invention. Speech signal decoding device 100 illustrated in FIG. 1 decodes an encoded signal that has been encoded by a speech encoding method called code-excited linear prediction (CELP).

Human voice is generated such that a sound generated by vibration of the vocal cords resonates through the vocal tract including the throat, the oral cavity, and the nasal cavity. The CELP is configured to compress an amount of information of a speech signal by patterning while dividing the speech signal into two components that are a sound source component caused by vibration of the vocal cords and a component associated with a change in sound caused by resonance through the vocal tract (spectral envelope component), based on a voice generation process. In other words, in the CELP, when encoding, patterns respectively similar to the two components of an input speech signal are extracted among a number of patterns provided in a code book in advance, and the speech signal is encoded by using codes respectively defined for the extracted patterns. When decoding, two components decoded from an encoded signal are synthesized to obtain a decoded signal.

In speech signal decoding device 100 illustrated in FIG. 1, an encoded signal that is a speech signal encoded by the CELP method in an encoding device (not illustrated) is separated into an adaptive code-book code, a fixed code-book code, a gain code, and a linear prediction coefficient code by demultiplexer 101. Speech signal decoding device 100 decodes the encoded signal for each frame.

The adaptive code-book code, the fixed code-book code, the gain code, and the linear prediction coefficient code are respectively input to adaptive code-book decoder 102, fixed code-book decoder 103, gain decoder 104, and synthesis filter 111.

Adaptive code-book decoder 102 generates an adaptive code-book vector identified by the adaptive code-book code, and outputs the generated adaptive code-book vector to amplifier 105. An adaptive code book (ACB) uses an excitation signal that has been generated in past and is to be output from adder 108 described later. Note that the adaptive code-book vector corresponds to an adaptive code-book decoded component in the present invention.

Fixed code-book decoder 103 generates a fixed code-book vector designated by the fixed code-book code, and outputs the generated fixed code-book vector to amplifier 106. A fixed code book (FCB) is for generating a plurality of sets of waveform data, which is predetermined. More specifically, the fixed code book may be a memory storing a predetermined number of vectors of a Gaussian noise sequence, a memory used for generating predetermined types of pulse vectors by combining positions of pulses that can be disposed at predetermined positions with corresponding polarities, a memory storing a predetermined number of vectors that are provided in advance for representing a characteristic shape of a sound source signal, or a combination thereof. Note that the fixed code-book vector corresponds to a fixed code-book decoded component in the present invention.

Gain decoder 104 decodes the gain code to generate an adaptive code-book gain and a fixed code-book gain, and outputs the adaptive code-book gain and the fixed code-book gain to amplifier 105 and amplifier 106, respectively.

Amplifier 105 multiplies the adaptive code-book vector output from adaptive code-book decoder 102 by the adaptive code-book gain output from gain decoder 104, and outputs the adaptive code-book vector as the multiplied result to ratio calculator 107 and adder 108.

Amplifier 106 multiplies the fixed code-book vector output from fixed code-book decoder 103 by the fixed code-book gain output from gain decoder 104, and outputs the multiplied result to ratio calculator 107 and adder 108.

Ratio calculator 107 calculates an amplitude ratio (ACB/FCB amplitude ratio) between the adaptive code-book vector as the multiplied result output from amplifier 105 and the fixed code-book vector as the multiplied result output from amplifier 106, and outputs the calculated ACB/FCB amplitude ratio to determination unit 109. Alternatively, ratio calculator 107 may calculate an energy ratio between the adaptive code-book vector as the multiplied result and the fixed code-book vector as the multiplied result.

Adder 108 adds the adaptive code-book vector as the multiplied result output from amplifier 105 to the fixed code-book vector as the multiplied result output from amplifier 106, to generate the excitation signal, and outputs the excitation signal to adaptive code-book decoder 102 and attenuator 110.

In a case where the ACB/FCB amplitude ratio (or energy ratio, the same applies hereafter) output from ratio calculator 107 is larger than a predetermined threshold, determination unit 109 outputs a detection signal (for example, 1) to attenuator 110. In a case where the ACB/FCB amplitude ratio is the predetermined threshold or less, determination unit 109 does not output the detection signal (that is, outputs a non-detection signal (for example, 0)). Herein, the case where the ACB/FCB amplitude ratio is larger than the predetermined threshold is, for example, a case where a random signal is generated by an error in the encoded signal, that is, a case where the decoded signal is abnormal. In other words, determination unit 109 determines whether the ACB/FCB amplitude ratio is larger than the predetermined threshold to determine whether a decoded signal of a certain frame is normal.

Figure 2B:
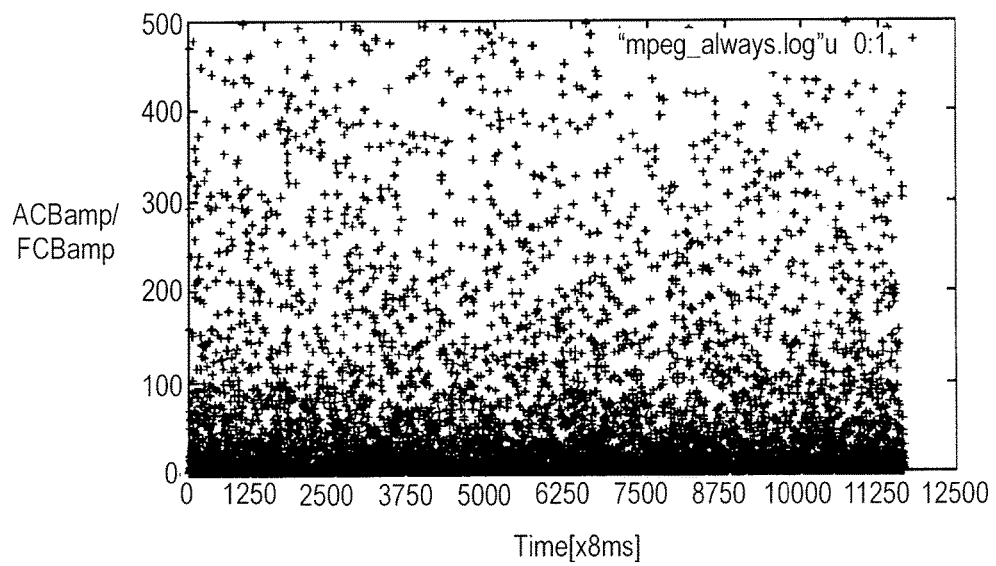
FIG. 2B is a view illustrating the ACB/FCB amplitude ratio.

Herein, a meaning of the determination performed by determination unit 109 will be described. FIGS. 2A and 2B are views illustrating the ACB/FCB amplitude ratio. FIG. 2A illustrates the ACB/FCB amplitude ratio in a case where an encoded signal of a sweep signal is decoded as an example of a signal having strong periodicity. For example, as illustrated in FIG. 2A, in the case of the sweep signal, the ACB/FCB amplitude ratio takes a value of approximately 50 or less. This holds true even in the case where a sinusoidal signal having a fixed frequency is used. In other words, the ACB/FCB amplitude ratio that possibly appears upon decoding of encoded information without an error takes a value of approximately 50 or less.

On the other hand, FIG. 2B illustrates the ACB/FCB amplitude ratio in a case where an encoded signal generated by using a random number is decoded. When a random number sequence is decoded as the encoded signal, the ACB/FCB amplitude ratio having a value considerably exceeding 50 frequently appears as illustrated in FIG. 2B. The case where the ACB/FCB amplitude ratio considerably exceeds 50 is a case where amplitude of the fixed code-book vector is extremely smaller than amplitude of the adaptive code-book vector. Note that a case where such an encoded result is obtained is presumably a case where an input signal to the encoding device is such a signal as the sinusoidal signal having extremely strong periodicity.

As described above, the ACB/FCB amplitude ratio that possibly appears upon decoding of encoded information without an error takes a value of approximately 50 or less. Accordingly, determination unit 109 sets the predetermined threshold to 50, and determines that, in a case where an ACB/FCB amplitude ratio of an encoded signal is 50 or less that is the threshold, the encoded signal includes no error. In contrast, determination unit 109 determines that, in a case where an ACB/FCB amplitude ratio of a certain encoded signal is larger than 50 that is the threshold, the encoded signal includes an error. Note that setting the threshold to 50 is an example, and the present invention is not limited thereto. For example, when the threshold is implemented with a fixed-point arithmetic operation, the threshold may be 64 that is a power of two. Note that an optimal threshold possibly differs according to a CELP codec used in an application destination, and therefore the threshold may be set as appropriate.

The description will be returned to FIG. 1. When the detection signal is output from determination unit 109, that is, when the decoded signal of the frame is determined to be abnormal, attenuator 110 attenuates a signal level of the excitation signal output from adder 108 to output the attenuated excitation signal to synthesis filter 111. An amount to which the excitation signal is attenuated by attenuator 110 is not limited in the present invention, but may be set to be attenuated to ⅒, for example. When the detection signal is not output from determination unit 109 (that is, when the non-detection signal is output), that is, when the decoded signal of the frame is normal, attenuator 110 outputs the excitation signal to synthesis filter 111 without attenuation.

Synthesis filter 111 decodes a linear prediction coefficient from the linear prediction coefficient code output from demultiplexer 101 to generate a linear prediction (LP) filter. Synthesis filter 111 outputs, as a decoded speech signal, a synthesized signal obtained by being driven by the excitation signal output from attenuator 110 using the LP filter as the synthesis filter.

As described above, speech signal decoding device 100 calculates the ACB/FCB amplitude ratio in each frame of the input encoded signal, and, when the amplitude ratio is larger than the predetermined threshold, determines that the frame is abnormal to attenuate the signal level of the frame. This makes it possible to avoid a case where an abnormal sound with large volume is generated by reproducing a decoded signal of the abnormal frame.

However, the ACB/FCB amplitude ratio of the abnormal frame is not necessarily larger than the predetermined threshold. As illustrated in FIG. 2B, there is a case where even the ACB/FCB amplitude ratio of the abnormal frame takes a value of 50 or less that is the predetermined threshold. However, when the abnormal frame is generated by an error in the encoded signal caused by, for example, a transmission failure, several abnormal frames continuously appear in many cases. In such cases, any of the ACB/FCB amplitude ratios of the continuous abnormal frames may exceed the predetermined threshold with a high possibility. Accordingly, speech signal decoding device 100 can detect a segment where the abnormal frames continuously appear, with a high probability, and therefore the case where the abnormal sound with large volume is generated by reproducing the decoded signals of the abnormal frames can be avoided with high accuracy.

As described above, the abnormal frames continuously appear in many cases. Therefore, when determination unit 109 outputs the detection signal at a certain frame, that is, when the frame is abnormal, attenuator 110 preferably attenuates decoded signals of a predetermined number of frames subsequent to the frame, as well as the frame. With such processing, even in a case where, although the abnormal frames continuously appear, for example, the ACB/FCB amplitude ratios of frames subsequent to a certain frame take the predetermined value or less, and therefore determination unit 109 cannot determine that those frames are abnormal, attenuator 110 can forcibly attenuate the excitation signals of those frames. Therefore, generation of an abnormal sound with large volume by reproducing a decoded signal of the abnormal frame can be avoided with high accuracy. Note that the predetermined number of frames to be attenuated by attenuator 110 is not limited in the present invention.

Note that, when only one abnormal frame is present among successive normal frames in the encoded signals, as described above, speech signal decoding device 100 does not necessarily determine that the abnormal frame is abnormal. However, even when the abnormal encoded signal is present only in one frame, the adaptive code-book gain in this frame does not become abnormally large. Therefore, when a decoded speech signal of this frame is reproduced, the abnormal sound with large volume is unlikely to be reproduced. Further, even when the abnormal sound with the large volume is reproduced as the speech signal, a time for reproducing is one frame which is extremely short. Therefore, it can be considered that the reproduced speech signal is hardly perceived as a fatal abnormal sound with large volume.

However, when adaptive code-book decoder 102 decodes several normal frames subsequent to the abnormal frame, the excitation signal of the abnormal frame is used as the adaptive code book. Therefore, even when an input frame is normal, during several frames subsequent to the abnormal frame, a signal in a subsequent stage of adaptive code-book decoder 102 is likely to be abnormal. In this case, since the abnormal frames continuously appear for several frame periods, any of the abnormal frames is likely to have an abnormally large adaptive code-book gain. Therefore, determination unit 109 can detect the frame without problems. With this configuration, attenuator 110 attenuates signal levels of the excitation signals of the abnormal frames. Thus this attenuation makes it possible to avoid generation of the abnormal sound with large volume, by detecting an abnormally large adaptive code-book component even when an adverse effect of an error propagates.

Figure 4:
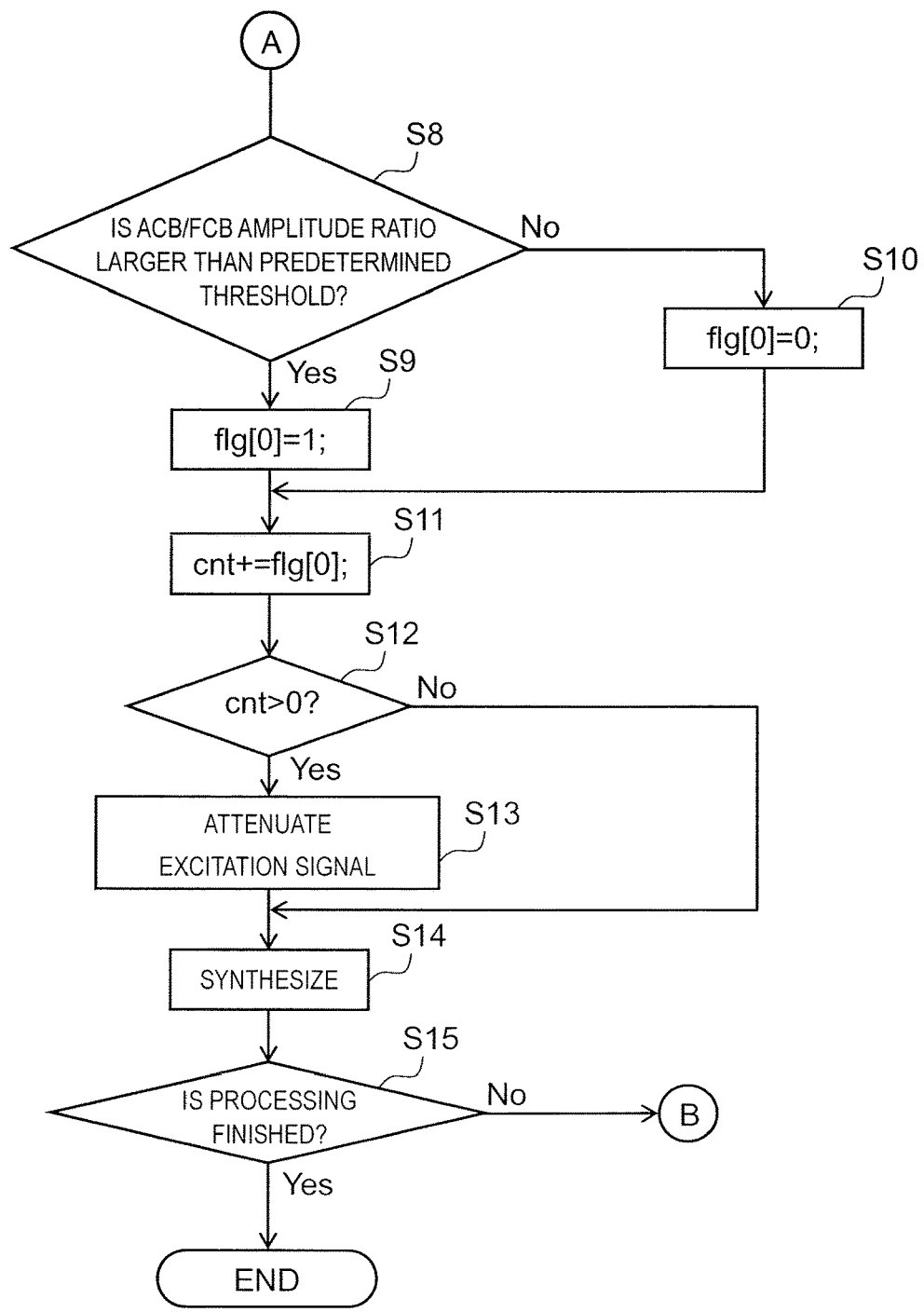
FIG. 4 is a flowchart illustrating the operation example of the speech signal decoding device.

Hereinafter, an operation example of speech signal decoding device 100 will be described. FIGS. 3 and 4 are flowcharts illustrating the operation example of speech signal decoding device 100.

Speech signal decoding device 100 first clears (sets to 0) counter cnt and abnormality detection flags flg [0: nf−1], when starting its operation (step S1). Counter cnt is a counter that counts a number of segments in which the ACB/FCB amplitude ratio exceeds the threshold among nf segments in past. Abnormality detection flags flg [0: nf−1] collectively serve as a memory storing flags each indicating whether the ACB/FCB amplitude ratio exceeds the threshold in nf segments in past including a current segment. Each of flg [0: nf−1] stores 1 when the ACB/FCB amplitude ratio exceeds the threshold, and stores 0 when the ACB/FCB amplitude ratio does not exceed the threshold. The segment is a time length (a block length) used as a unit for decoding the adaptive code book. The segment may be replaced by the frame. However, when one frame is divided into a plurality of sub-frames and decoding is performed for every sub-frame, the segment corresponds to the sub-frame. The number of the segment nf is a number of the segments used as a unit for determining whether the ACB/FCB amplitude ratio exceeding the threshold is present in corresponding segments. The number of the segment nf is 15, for example.

Demultiplexer 101 separates an input encoded signal into the adaptive code-book code, the fixed code-book code, the gain code, and the linear prediction coefficient code for each segment (step S2). Adaptive code-book decoder 102 generates the adaptive code-book vector using the adaptive code-book code. Fixed code-book decoder 103 generates the fixed code-book vector using the fixed code-book code. Gain decoder 104 decodes a gain signal to generate the adaptive code-book gain and the fixed code-book gain (step S3). In step S3, order of processes of adaptive code-book decoder 102, fixed code-book decoder 103, and gain decoder 104 is not limited in the present invention. Those processes may simultaneously be performed, or may be performed in predetermined order.

Next, amplifier 105 multiplies the adaptive code-book vector by the adaptive code-book gain to generate the adaptive code-book vector as the multiplied result. Amplifier 106 multiplies the fixed code-book vector by the fixed code-book gain to generate the fixed code-book vector as the multiplied result (step S4). In step S4, order of processes of amplifiers 105 and 106 is not limited in the present invention. Those processes may simultaneously be performed, or may be performed in predetermined order.

Then, ratio calculator 107 calculates an amplitude ratio (ACB/FCB amplitude ratio) between the adaptive code-book vector as multiplied result and the fixed code-book vector as the multiplied result (step S5). Adder 108 adds the adaptive code-book vector as multiplied result to the fixed code-book vector as multiplied result to generate the excitation signal (step S6). Note that step S5 and step S6 may be performed in any order, or may simultaneously be performed.

At this moment, speech signal decoding device 100 subtracts a value of oldest abnormality detection flag flg [nf−1] from counter cnt, and shifts each content in abnormality detection flags flg [ ] one by one (step S7). With this configuration, speech signal decoding device 100 prepares to reject an oldest segment from a range of counter cnt and to include a current segment in the range of counter cnt.

Determination unit 109 determines whether the ACB/FCB amplitude ratio of the current segment is larger than the predetermined threshold, for example, 50 (step S8). When the ACB/FCB amplitude ratio is larger than the predetermined threshold, the flow proceeds to step S9, and otherwise, proceeds to step S10.

When determination unit 109 determines that the ACB/FCB amplitude ratio of the current segment is larger than the predetermined threshold, the current segment is abnormal. Therefore, abnormality detection flag flg [0] of the current segment is set to 1 (step S9). On the other hand, when determination unit 109 determines that the ACB/FCB amplitude ratio is the predetermined threshold or less, the current segment is normal. Therefore, abnormality detection flag fig [0] of the current segment is set to 0 (step S10). A value of abnormality detection flag fig [0] of the current segment is added to counter cnt to update counter cnt to a latest state (step S11).

Speech signal decoding device 100 then determines whether counter cnt is larger than 0 (step S12). When counter cnt is larger than 0, the flow proceeds to step S13, and otherwise (when counter cnt is 0), proceeds to step S14.

Counter cnt larger than 0 means that at least one of segments in which abnormality is detected is included in nf segments in past including the current segment. Therefore, attenuator 110 attenuates the excitation signal generated in step S6 to predetermined times, for example, to 1/10 (step S13). Synthesis filter 111 generates the LP filter based on the linear prediction coefficient code, and generates the decoded speech signal from the excitation signal by using the LP filter as the synthesis filter (step S14). With this configuration, the decoded speech signal in which a signal level of the excitation signal of the abnormal frame is attenuated is output.

On the other hand, counter cnt having 0 means that there is no segment in which abnormality is detected in nf segments in past including the current segment. Therefore, in step S14, a decoded speech signal based on an excitation signal that is not attenuated is generated. Therefore, a signal level of the normal frame is not attenuated, and thus a decoded speech signal with normal volume can be generated.

Speech signal decoding device 100 determines whether the current segment reaches the end of the encoded signal (step S15). When the current segment reaches the end of the encoded signal, speech signal decoding device 100 determines that decoding of the encoded signal is finished and finishes its processing. Otherwise, the flow returns to step S2 after advancing the segment by one.

As described above, speech signal decoding device 100 according to the exemplary embodiment of the present invention includes adaptive code-book decoder 102, fixed code-book decoder 103, ratio calculator 107, determination unit 109, and attenuator 110. Adaptive code-book decoder 102 generates the adaptive code-book vector using the adaptive code-book code of the encoded signal encoded by the CELP method. Fixed code-book decoder 103 generates the fixed code-book vector using the fixed code-book code of the encoded signal. Ratio calculator 107 calculates the amplitude ratio or the energy ratio between the adaptive code-book vector and the fixed code-book vector. Determination unit 109 determines whether the amplitude ratio or the energy ratio, which has been calculated by ratio calculator 107, exceeds the predetermined threshold. When determination unit 109 determines that the amplitude ratio or the energy ratio exceeds the predetermined threshold, attenuator 110 attenuates the excitation signal that has been defined by adding the adaptive code-book vector to the fixed code-book vector.

In the CELP, it is experimentally confirmed that a value of the fixed code-book vector does not become extremely smaller than the adaptive code-book vector. Therefore, when the ACB/FCB amplitude ratio or the ACB/FCB energy ratio of a certain frame exceeds the predetermined threshold, that is, when the amplitude of the fixed code-book vector is extremely smaller than the amplitude of the adaptive code-book vector, it is mostly determined that a decoded signal of the frame is not a normal signal. Accordingly, with the above-described configuration, speech signal decoding device 100 according to the exemplary embodiment of the present invention determines that, when the ACB/FCB amplitude ratio or the ACB/FCB energy ratio of a certain frame exceeds the predetermined threshold, the decoded signal of the frame is abnormal, and attenuates the excitation signal of the frame. Therefore, generation of an abnormal sound with large volume by reproducing a decoded signal of the abnormal frame can be avoided with high accuracy.

In speech signal decoding device 100 according to the exemplary embodiment of the present invention, when a frame whose amplitude ratio or energy ratio is determined to exceed the predetermined threshold by determination unit 109 is present, attenuator 110 attenuates the excitation signals of the predetermined number of frames subsequent to the determined frame. Thus, even in the case where, although the abnormal frames continuously appear, for example, the ACB/FCB amplitude ratios or the ACB/FCB energy ratios of frames subsequent to a certain frame take the predetermined value or less and therefore those frames cannot be determined to be abnormal, speech signal decoding device 100 forcibly attenuates the excitation signals of those frames. Therefore, generation of an abnormal sound with large volume by reproducing a decoded signal of the abnormal frame can be avoided with high accuracy.

Speech signal decoding device 100 according to the exemplary embodiment of the present invention has a configuration, in which attenuator 110 attenuates the excitation signals, in a preceding stage of synthesis filter 111. When the attenuator is disposed in a subsequent stage of synthesis filter 111, discontinuity in signals may be caused at a boundary of a frame. However, when attenuator 110 is disposed in the preceding stage of synthesis filter 111 and synthesis filter 111 is driven by the signal after attenuation, which causes the discontinuity at the boundary of the frame, a decoded speech signal maintaining continuity between frames can be generated. In other words, since speech signal decoding device 100 performs the attenuating processing in the precedent stage of synthesis filter 111 as described above, the discontinuity between frames is not caused.

INDUSTRIAL APPLICABILITY

The present invention is suitable for a speech signal decoding device configured to decode a speech signal encoded by a CELP method.

REFERENCE MARKS IN THE DRAWINGS 100 speech signal decoding device
101 demultiplexer
102 adaptive code-book decoder
103 fixed code-book decoder
104 gain decoder
105 amplifier
106 amplifier
107 ratio calculator
108 adder
109 determination unit
110 attenuator
111 synthesis filter

The invention claimed is:

1. A speech signal decoding device, comprising:
an adaptive code-book decoder that generates an adaptive code-book decoded component using an adaptive code-book (ACB) code of an encoded speech signal encoded by a code-excited linear prediction (CELP) method;
a fixed code-book decoder that generates a fixed code-book decoded component using a fixed code-book (FCB) code of the encoded speech signal;
a ratio calculator that calculates an ACB/FCB amplitude ratio between the adaptive code-book decoded component and the fixed code-book decoded component;
a determiner that determines whether there is an error in the encoded speech signal based on whether the amplitude ratio exceeds a predetermined threshold or not, the predetermined threshold being set to a value exceeding a maximum value of the ACB/FCB amplitude ratio that possibly appears upon decoding of the encoded speech signal without an error,
wherein, when the ACB/FCB amplitude ratio exceeds the predetermined threshold, the determiner determines the encoded speech signal has an error, and when the ACB/FCB amplitude ratio is equal to or less than the predetermined threshold, the determiner determines the encoded speech signal has no error; and
an attenuator that attenuates an excitation signal that has been defined by adding the adaptive code-book decoded component to the fixed code-book decoded component, when the determiner determines that the ACB/FCB amplitude ratio exceeds the predetermined threshold.

2. The speech signal decoding device according to claim 1, further comprising:
a demultiplexer that separates the encoded speech signal into the adaptive code-book code and the fixed code-book code for each frame.

3. The speech signal decoding device according to claim 2,
wherein, when a frame whose ACB/FCB amplitude ratio is determined to exceed the predetermined threshold by the determiner is present, the attenuator attenuates excitation signals of a predetermined number of frames subsequent to the determined frame.

4. The speech signal decoding device according to claim 1, further comprising;
a synthesis filter that generates a decoded speech signal from the excitation signal attenuated by the attenuator.

5. A method for decoding a speech signal, comprising:
generating an adaptive code-book decoded component using an adaptive code-book (ACB) code of an encoded speech signal encoded by a code-excited linear prediction (CELP) method;
generating a fixed code-book decoded component using a fixed code-book (FCB) code of the encoded speech signal;
calculating an ACB/FCB amplitude ratio between the adaptive code-book decoded component and the fixed code-book decoded component;
determining whether there is an error in the encoded speech signal based on whether the ACB/FCB amplitude ratio exceeds a predetermined threshold or not, the predetermined threshold being set to a value exceeding a maximum value of the ACB/FCB amplitude ratio that possibly appears upon decoding of the encoded speech signal without an error, wherein, when the ACB/FCB amplitude ratio exceeds the predetermined threshold, the encoded speech signal is determined to have an error, and when the ACB/FCB amplitude ratio is equal to or less than the predetermined threshold, the encoded speech signal is determined to have no error; and attenuating an excitation signal that has been defined by adding the adaptive code-book decoded component to the fixed code-book decoded component, when the ACB/FCB amplitude ratio is determined to exceed the predetermined threshold.

6. The speech signal decoding device according to claim 1, wherein the predetermined threshold is equal to 50.

* * * * *